(12) United States Patent
Lin et al.

(10) Patent No.: US 6,596,553 B1
(45) Date of Patent: Jul. 22, 2003

(54) METHOD OF PINHOLE DECORATION AND DETECTION

(75) Inventors: David Lin, Sunnyvale, CA (US); Scott A. Bell, San Jose, CA (US); Philip A. Fisher, Foster City, CA (US); Srikanteswara Dakshina-Murthy, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/180,141

(22) Filed: Jun. 26, 2002

(51) Int. Cl.$^7$ .............................................. H01L 21/66
(52) U.S. Cl. ............................................ 438/14; 438/7
(58) Field of Search .......................... 438/8, 9, 14, 16, 438/738, 769

(56) References Cited

U.S. PATENT DOCUMENTS

| 5,271,796 | A | * | 12/1993 | Miyashita et al. | .......... 156/626 |
| 6,162,735 | A | * | 12/2000 | Zimmermann et al. | ..... 438/712 |
| 6,225,137 | B1 | * | 5/2001 | Lin | .............................. 438/14 |

* cited by examiner

*Primary Examiner*—Kamand Cuneo
*Assistant Examiner*—Asok Kumar Sarkar
(74) *Attorney, Agent, or Firm*—Foley & Lardner

(57) ABSTRACT

An exemplary embodiment relates to a method of pinhole decoration and detection. The method can include providing a material layer above an amorphous carbon layer where the material layer has a pinhole, providing a film over the material layer where the film has a substantially planar surface except above the pinhole, and detecting the pinhole by detecting a non-planar location on the substantially planar surface of the film.

20 Claims, 4 Drawing Sheets

METHOD OF PINHOLE DECORATION AND DETECTION

FIELD OF THE INVENTION

The present disclosure relates generally to integrated circuits and methods of manufacturing integrated circuits. More particularly, the present disclosure relates to a method of pinhole decoration and detection.

BACKGROUND OF THE INVENTION

Integrated circuits (ICs), such as, ultra-large scale integrated (ULSI) circuits, can include as many as one million transistors or more. The ULSI circuit can include complementary metal oxide semiconductor (CMOS) field effect transistors (FETS).

In the fabrication of devices on a wafer substrate, such as silicon, to form an IC, various metal layers and insulation layers can be deposited thereon. Insulation layers, such as, silicon dioxide, silicon oxynitride, fluorinated silicate glass (FSG), and spin-on glass (SOG) can provide electrical insulation between metal layers. The insulation layers can be protective layers or gap filling layers to achieve planarization in the wafer substrate. Insulation layers can be deposited by conventional technique such as plasma enhanced chemical vapor deposition (PECVD) and atmospheric pressure CVD.

Conventionally, a first level metal layer is separated by one or more insulation layers from a second level metal layer. This second level metal layer may be separated by one or more further insulation layers from a third level metal layer. These metal layers can be interconnected by metallization through vias or small holes or apertures etched in the intervening insulation layers.

In order to interconnect stacked layers, the stacked layers undergo photolithographic processing to provide a pattern and form vias. The top layer on the wafer substrate is covered with a photoresist layer of photo-reactive polymeric material for patterning via a mask. Light, such as, visible or ultraviolet (UV) light is directed through the mask onto the photoresist layer to expose it in the mask pattern. The polymeric material of the photoresist layer is transparent to the light yet photo-reactive to change its chemical properties, thereby permitting its patterning.

An antireflective coating (ARC) layer such as an organic ARC layer, can be provided at the top portion of the wafer substrate to minimize reflection of light back to the photoresist layer for more uniform patterning.

The photoresist may be of negative or positive type. In a negative photoresist, the exposed (polymerized) areas become insoluble while the unexposed (unpolymerized) areas dissolve in a later applied developer liquid. In a positive photoresist, the exposed (degraded) soluble areas dissolve in the developer liquid while the unexposed (insoluble) areas remain. In both instances, the photoresist material remaining on the wafer substrate forms the pattern to serve as a mask for etching in turn of the pertinent layers.

Etching processes are selective to particular types of materials with respect to other types of materials. For example, when etching via holes through a dielectric material, the etching process is selective to the dielectric material with respect to layers underlying the dielectric material. Generally, it is desirable to use anisotropic etching processes (etching processes with a high rate vertical direction etching and low rate or inhibited horizontal direction etching). Anisotropic etching processes are distinguished from isotropic etching processes (processes that etch the exposed surfaces equally in all directions). Anistropic etching processes generally attempt to provide an etched structure of uniform vertical wall geometry or profile. Etching processes can be manifested as wet etching (solution) or dry etching (plasma etching or reactive ion etching) techniques, depending on the physical and chemical characteristics of the material being etched and of the neighboring material.

For maximizing the integration (connection) of device components in the available area on the wafer substrate to fit more components in the same area, increasing miniaturization is required. As narrower metal lines and closer pitch dimensions are needed to achieve increasingly dense packing of the components, they become more vulnerable to defects at the minute tolerances involved. This has become apparent as IC miniaturization has increased to very large scale integration (VLSI) at sub-quarter micron and smaller dimensions.

Contaminants that are incompatible with the photo-reactive material can migrate into the photoresist layer from the ARC layer or other layer. These contaminants can poison the photoresist layer, causing non-uniformity of the reaction therein by extraneous chemical interaction with the polymeric material. This phenomenon is commonly called "photoresist poisoning" and leads to the formation of a photoresist footing where a positive photoresist is used, or to a photoresist pinching where a negative photoresist is used.

A disadvantage of common ARC layers (e.g., silicon oxynitride films) lies in their incompatibility with modern DUV (deep UV) photoresist systems due to reactive contaminants that are present therein. These reactive nitrogen substances tend to migrate or diffuse out of the silicon oxynitride layer and chemically interact with constituents of the photoresist layer.

As earlier above, such chemical interaction, commonly called photoresist poisoning, leads to photoresist footing or photoresist pinching. The photoresist footing or photoresist pinching problem leads to imperfect transfer of the photoresist pattern to the underlying substrate and ultimately limits the minimum spatial resolution of IC components.

Small holes or "pinholes" in insulating layers, such as silicon oxide nitride (SiON), can serve to facilitate resist poisoning. Accordingly, detecting pinholes early in development is important. Nevertheless, some pinholes are too small for many conventional state-of-the-art defect inspection tools to capture. Further, in the effort to make smaller and smaller transistors, the effects of small defects (e.g., small pinholes) increase in importance.

A variety of techniques exist for inspecting the surface of semiconductor wafers. These techniques include light scattering topography (LST), stylus profilometry, phase shift interferometry, and atomic force microscopy (FM). However, surface defects, such as pinholes, are not always detectable using conventional inspection devices and techniques.

Thus, there is a need to be able to enlarge and decorate small pinholes that are smaller than the inspection tool limit. Further, there is a need to capture pinholes. Even further, there is a need to more readily detect small pinholes. Yet further, there is a need for a method of inspecting a wafer to identify the presence of small pinholes.

SUMMARY OF THE INVENTION

An exemplary embodiment relates to a method of pinhole decoration and detection. The method can include providing a material layer above an amorphous carbon layer, providing a film over the material layer, and detecting a the pinhole. The material layer has a pinhole and a substantially planar surface except above the pinhole. The pinhole is detected by detecting a non-planar location on the substantially planar surface of the film.

Another exemplary embodiment relates to a method of detecting a pinhole in a layer of SiON to facilitate the prevention of resist poisoning. The method can include providing a SiON layer above an amorphous carbon layer where the SiON layer has a pinhole, providing a material over the SiON layer, and detecting the pinhole by detecting a location indicated by the material.

Another exemplary embodiment relates to a method of decorating and detecting a pinhole having a width smaller than detection tool limits. The method can include providing an amorphous carbon layer above a substrate, providing a reflective layer above the amorphous carbon layer, introducing a detection-assisting layer above the reflective layer to facilitate detection of a pinhole in the reflective layer, and detecting the pinhole.

Other principle features and advantages of the invention will become apparent to those skilled in the art upon review of the following drawings, the detailed description, and the appended claims.

BRIEF DESCRIPTION OF THE DRAWINGS

The exemplary embodiments of the disclosure will hereafter be described with reference to the accompanying drawings, wherein like numerals denote like elements, and.

DETAILED DESCRIPTION OF EXEMPLARY EMBODIMENTS

Figure 1:
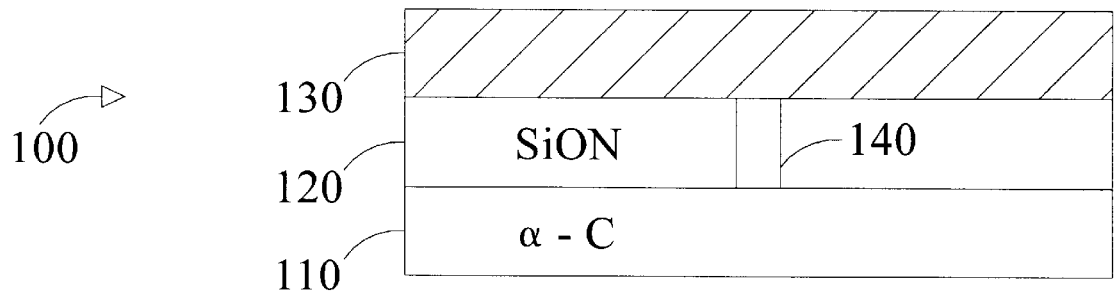
FIG. 1 is a schematic cross-sectional view representation of a portion of an integrated circuit showing a pinhole.

Referring to FIG. 1, a portion 100 of an integrated circuit includes an amorphous carbon layer 110, a material layer 120, and a photoresist layer 130. Layer 110 can be disposed above a dielectric material, a substrate, a conductive layer, or any layer used in integrated circuit fabrication. Amorphous carbon layer 110 can include an amorphous carbon material and have a thickness of 200–1000 Angstroms of chemical vapor deposition (CVD) film as an etch hardmask for polysilicon patterning.

Material layer 120 is provided above amorphous carbon layer 110. Material layer 120 can be silicon oxynitride (SiON) or other suitable material. Material layer 120 can have a thickness of 50–1000 Angstroms of CVD film as lithography anti-reflective coating for polysilicon patterning. In an exemplary embodiment, material layer 120 includes a pinhole 140. Pinhole 140 is an aperture having a width of less than 200 nm.

Pinhole 140 is undesired because it can facilitate the poisoning of photoresist layer 130 by material contained in amorphous carbon layer 110. Detection devices are available to detect pinholes have widths of 200 nm or larger. Nevertheless, pinholes with smaller dimensions cannot be easily detected using conventional techniques.

Figure 2:
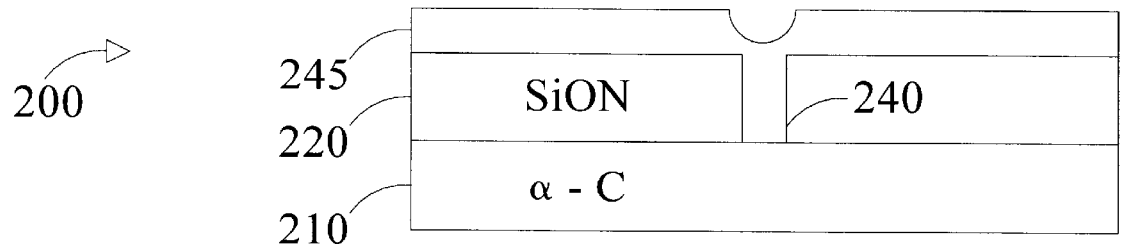
FIG. 2 is a schematic cross-sectional view representation of a portion of an integrated circuit showing a pinhole detection operation in accordance with an exemplary embodiment.

FIG. 2 illustrates a portion 200 of an integrated circuit, including an amorphous layer 210 and a material layer 220. Amorphous carbon layer 210 can include an amorphous carbon material and have ;a thickness of 200–1000 Angstroms. Layer 210 is similar to layer 110 described with reference to FIG. 1.

Material layer 220 is provided above amorphous carbon layer 210. Material layer 220 can be silicon oxynitride (SiON) or other suitable material. Material layer 220 can have a thickness of 50–1000 Angstroms. Layer 220 is similar to layer 110 described with reference to FIG. 1. In an exemplary embodiment, material layer 220 includes a pinhole 240. Pinhole 240 is an aperture having a width of less than 200 nm.

A decoration material layer 245 can be provided to portion 200 that facilitates detection of pinhole 240. In one exemplary embodiment, decoration material layer 245 includes acid, such as, SPM/APM or HF. The acid removes portions of sidewalls of pinhole 240, thereby enlarging pinhole 240 (e.g., decorating) to a size that is more easily detectable.

In another exemplary embodiment, the decoration material layer is a transparent film disposed over portion 200. The transparent film has a substantially planar surface with the exception of the area of the transparent film above pinhole 240. The non-planar area in the transparent film has a greater width than pinhole 240. As such, the non-planar area is more easily detected and can serve to provide an identifiable location point for pinhole 240. Use of the transparent film to decorate a pinhole is described below with reference to FIGS. 5–6.

Figure 3:
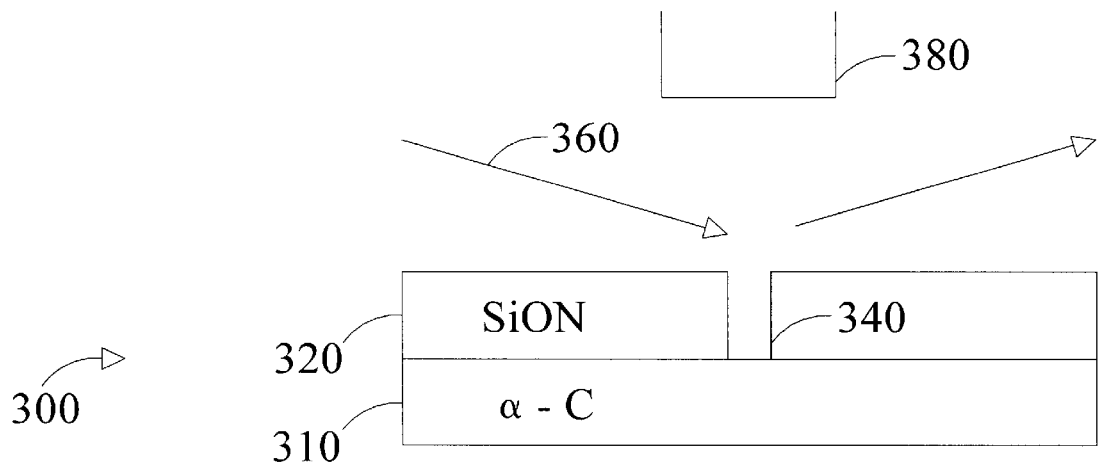
FIG. 3 is a schematic cross-sectional view representation of a portion of an integrated circuit showing a laser beam pinhole detection operation.

FIG. 3 illustrates a portion 300 of an integrated circuit. Portion 300 includes an amorphous carbon layer 310 similar to layer 110 described with reference to FIG. 1 and a material layer 320 similar to layer 120 with reference to FIG. 1. Material layer 320 can be silicon oxynitride (SION) or other suitable material. In an exemplary embodiment, material layer 320 includes a pinhole 340. Pinhole 340 is an aperture having a width of less than 200 nm.

In an exemplary embodiment, a laser beam 360 is introduced to a surface of material layer 320. Laser beam 360 is preferably provided at an angle of 70 degrees, with respect to the planar surface of layer 320. A reflection of laser beam 360 off the surface of material layer 320 is generally not detected by detector 380. Due to i:he planar surface of material layer 320, laser beam 360 is reflected so that it does not strike detector 380. However, when laser beam 360 strikes pinhole 340, it is reflected in a number of diverse directions. The reflected light off pinhole 340 reaches detector 380 and can help in identifying the presence of pinhole 340. Detector 380 can be PMT (Photo Multiplier Tube) manufactured by KLA-Tencor of San Jose, Calif.

Figure 4:
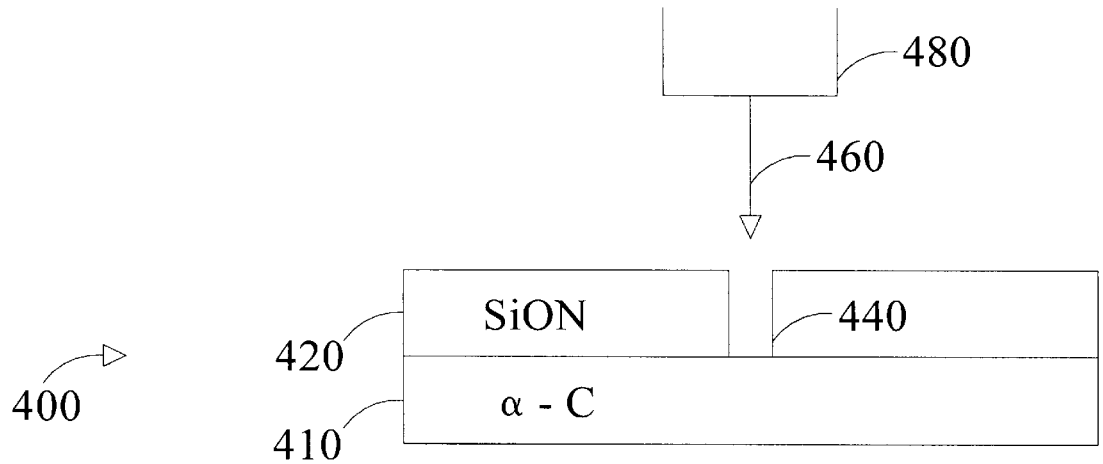
FIG. 4 is a schematic cross-sectional view representation of a portion of an integrated circuit showing a laser beam pinhole detection operation.

FIG. 4 illustrates a portion 400 of an integrated circuit. Portion 400 includes an amorphous carbon layer 410 similar to layer 110 described with reference to FIG. 1 and a material layer 420 similar to layer 120 described with reference to FIG. 1. Material layer 420 can be silicon oxynitride (SiON) or other suitable material. In an exemplary embodiment, material layer 320 includes a pinhole 440. Pinhole 440 is an aperture in material layer 420 having a width of less than 200 nm.

In an exemplary embodiment, a laser beam 460 is applied to a surface of material layer 420. Laser beam 460 can be a 488 nm Argon laser. A detector 480 can be provided to detect reflections of laser beam 460 off the surface of material layer 420. Example detectors can include PMT or CCD (Charged Couple Device).

Laser beam 460 can be provided in a normal position with respect to the surface of material layer 420. A normal incident laser beam can be combined with dark field detection such that defects below the incident wave length can create enough scatter light for detectors to recognize. Thus, it is possible to detect pinhole 440.

Figure 5:
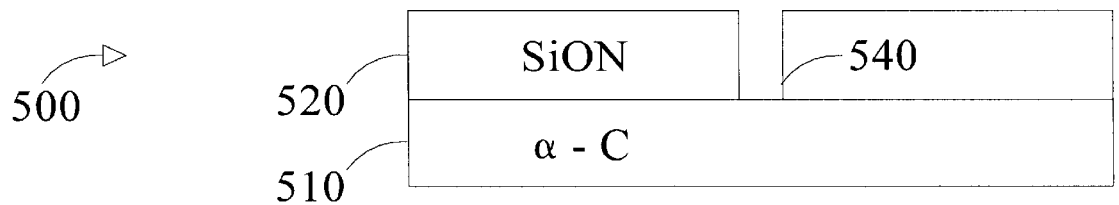
FIG. 5 is a schematic cross-sectional view representation of a portion of an integrated circuit showing a pinhole.

FIG. 5 illustrates a portion 500 of an integrated circuit including an amorphous carbon layer 510 similar to layer 110 described with reference to FIG. 1 and a material layer 520 similar to layer 120 described with reference to FIG. 1. Preferably, amorphous carbon layer 510 includes an amorphous carbon material and has a thickness of 200–1000 Angstroms. Other thicknesses may also be used.

Material layer 520 is provided above amorphous carbon layer 510. Material layer 520 can be silicon oxynitride (SiON) or other suitable material. Material layer 520 can have a thickness of 50–1000 Angstroms. In an exemplary embodiment, material layer 520 includes a pinhole 240. Pinhole 240 is an aperture having a width of less than 200 nm.

Figure 6:
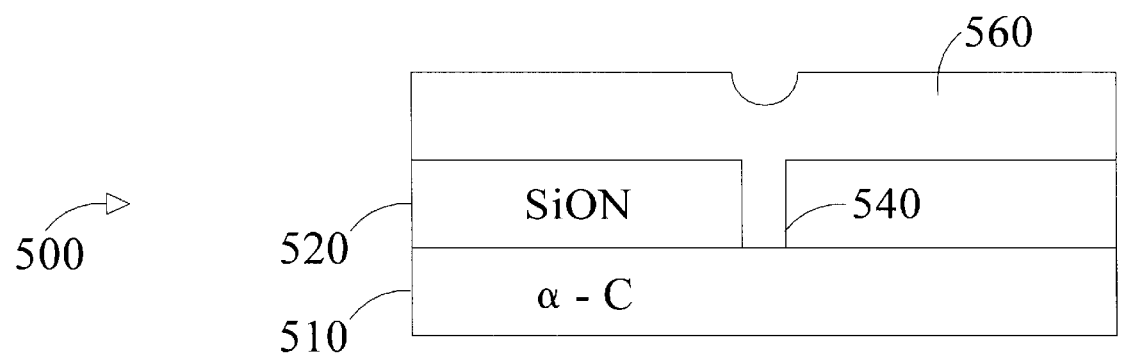
FIG. 6 is a schematic cross-sectional view representation of a portion of an integrated circuit showing a pinhole detection operation in accordance with an exemplary embodiment.

Referring now to FIG. 6, portion 500 is shown with a layer 550 disposed above material layer 520. Layer 550 can be a transparent film or other suitable material. In an exemplary embodiment, a photoresist deposition technique is utilized and layer 550 has a thickness of 1000–5000 Angstroms.

Advantageously, layer 550 is deposited with a thickness such that a top surface of layer 550 is substantially planar with the exception of the area of the top surface above pinhole 540. The area of the top surface of layer 550 above pinhole 540 has a lower cross-sectional thickness than other portions of layer 550.

The area of the top surface of layer 550 has a width that is greater than the width of pinhole 540. For example, the width of pinhole 540 can be 100 nm, whereas the width of the non-planar section of the top surface of layer 550 can be 100 nm–10 μm. Detectors can more readily detect the wider non-planar section. By detection of the non-planar section, detection of pinhole 540 is also accomplished.

Figure 7:
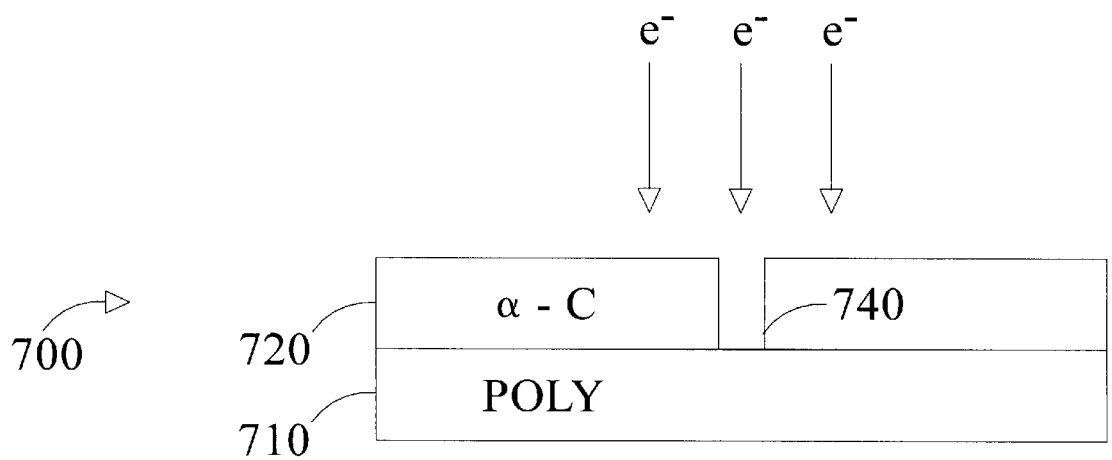
FIG. 7 is a schematic cross-sectional view representation of a portion of an integrated circuit showing a pinhole detection operation in accordance with an exemplary embodiment.

FIG. 7 illustrates a portion 700 of an integrated circuit. Portion 700 can include a polysilicon layer 710 and an amorphous carbon layer 720. Polysilicon layer 710 can include a material such as poly amorphous silicon, polysilicon germanium, or stacks thereof incorporating or implanted with common dopants and can have a thickness of 500–1500 Angstroms, for example.

In an exemplary embodiment, amorphous carbon layer 720 can include a small aperture or a pinhole 740. Pinhole 740 can have a cross-sectional width of 20 nm–200 nm. Amorphous carbon layer 720 can be conductive because of charge buildup. As such, pinhole 740 can be identified using an electron beam inspection technique coupled with voltage contrast. In such a procedure, electrons are introduced to amorphous carbon layer 720 and layer 710 is coupled to ground through the substrate or other paths.

Figure 8:
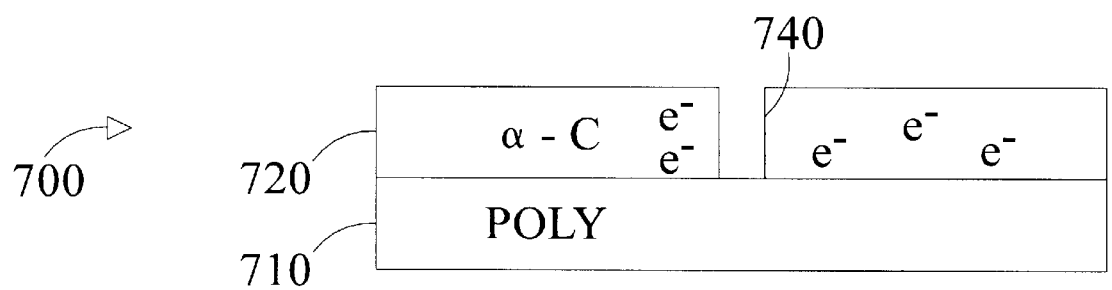
FIG. 8 is a schematic cross-sectional view representation of a portion of an integrated circuit showing a pinhole detection operation in accordance with an exemplary embodiment.

Referring to FIG. 8, amorphous carbon layer 720 of portion 700 does not allow electrons to pass through it. Instead, electrons can pass through pinhole 740 to reach layer 701. As such, it is possible to detect the presence of pinhole 740 by the behavior of electrons passing through pinhole 740 to reach layer 710.

While the exemplary embodiments illustrated in the FIG-URES and described above are presently preferred, it should be understood that these embodiments are offered by way of example only. Other embodiments may include, for example, different material layers and different acids and films to decorate the pinhole. The invention is not limited to a particular embodiment, but extends to various modifications, combinations, and permutations that nevertheless fall within the scope and spirit of the appended claims.

What is claimed is:

1. A method of pinhole decoration and detection, the method comprising:
   providing a material layer above an amorphous carbon layer, the material layer having a pinhole;
   providing a film over the material layer, the film having a substantially planar surface except above the pinhole; and
   detecting the pinhole by detecting a non-planar location on the substantially planar surface of the film.

2. The method of claim 1, wherein the material layer includes SiON.

3. The method of claim 1, wherein the film includes hydrofluoric (HF) acid.

4. The method of claim 1, wherein the film has a thickness of 50–1000 Angstroms.

5. The method of claim 1, wherein the amorphous carbon layer has a thickness of 200–1000 Angstroms.

6. The method of claim 1, wherein the non-planar location has a width of 200 nm or more.

7. The method of claim 1, wherein the pinhole has a width of 200 nm or less.

8. The method of claim 1, further comprising projecting a laser beam at the material layer before the film is provided and detecting the pinhole from the reflections of the laser beam off of the material layer.

9. The method of claim 1, wherein the non-planar location is detected using a laser beam.

10. A method of detecting a pinhole in a layer of SiON to facilitate the prevention of resist poisoning, the method comprising:
    providing a SiON layer above an amorphous carbon layer, the SiON layer having a pinhole;
    providing a material over the SiON layer; and
    detecting the pinhole by detecting a location indicated by the material.

11. The method of claim 10, wherein the material includes acid.

12. The method of claim 11, wherein detecting the pinhole includes detecting an enlarged pinhole created by the acid.

13. The method of claim 10, wherein the amorphous carbon layer has a width of 200–1000 Angstroms.

14. The method of claim 10, further comprising providing a photoresist layer above the SiON layer.

15. A method of decorating and detecting a pinhole having a width smaller than detection tool limits, the method comprising:

providing an amorphous carbon layer above a substrate;

providing a reflective layer above the amorphous carbon layer;

introducing a detection-assisting layer above the reflective layer to facilitate detection of a pinhole in the reflective layer; and detecting the pinhole.

16. The method of claim 15, wherein the detection-assisting layer includes a transparent film.

17. The method of claim 16, wherein the transparent film has a thickness of 50–1000 Angstroms.

18. The method of claim 15, wherein the pinhole has a width less than 200 nm.

19. The method of claim 15, wherein the detection-assisting layer includes acid.

20. The method of claim 19, wherein the acid enlarges the pinhole to a width of more than 200 nm.

* * * * *